(12) United States Patent
Ito et al.

(10) Patent No.: US 11,348,814 B2
(45) Date of Patent: May 31, 2022

(54) TRANSFER ABNORMALITY DETECTION SYSTEM AND TRANSFER ABNORMALITY DETECTION METHOD

(71) Applicant: Sinfonia Technology Co., Ltd., Tokyo (JP)

(72) Inventors: Izumi Ito, Tokyo (JP); Tomoya Mizutani, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 223 days.

(21) Appl. No.: 16/710,484

(22) Filed: Dec. 11, 2019

(65) Prior Publication Data

US 2020/0194292 A1   Jun. 18, 2020

(30) Foreign Application Priority Data

Dec. 14, 2018   (JP) .............................. JP2018-234178

(51) Int. Cl.
| | |
|---|---|
| *H01L 21/67* | (2006.01) |
| *H01L 21/677* | (2006.01) |
| *G01M 13/028* | (2019.01) |
| *B65G 1/04* | (2006.01) |
| *B65G 1/137* | (2006.01) |

(52) U.S. Cl.
CPC ...... *H01L 21/67265* (2013.01); *B65G 1/0457* (2013.01); *B65G 1/137* (2013.01); *G01M 13/028* (2013.01); *H01L 21/67294* (2013.01); *H01L 21/67769* (2013.01)

(58) Field of Classification Search
CPC .... B65G 1/0457; B65G 1/137; G01M 13/028
See application file for complete search history.

(56) References Cited

U.S. PATENT DOCUMENTS

| | | | | |
|---|---|---|---|---|
| 4,549,841 A | * | 10/1985 | Ishige | .................... B66F 9/186 294/81.1 |
| 2005/0139564 A1 | * | 6/2005 | Nakao | ................. B65G 1/0457 212/71 |

(Continued)

FOREIGN PATENT DOCUMENTS

| | | | | |
|---|---|---|---|---|
| JP | 2011086733 | | 4/2011 | |
| JP | 2020096118 A | * | 6/2020 | .......... G01M 13/028 |

*Primary Examiner* — Kaitlin S Joerger
(74) *Attorney, Agent, or Firm* — Kilpatrick Townsend & Stockton LLP

(57) ABSTRACT

There is provided a transfer abnormality detection system capable of receiving information from a container transfer device configured to transfer a transfer container and a mounting device configured to load the transfer container that is transferred by the container transfer device, the system including: a determination part configured to: record which container transfer device is transferring the transfer container based on a container identification ID assigned to each transfer container and a transfer device identification ID assigned to each transfer device; and determine an abnormality in either or both of the container transfer device and the transfer container by combining vibration detection information of the container transfer device obtained by a vibration detection part provided in the container transfer device and state detection information of the transfer container obtained by a container state detection part provided in the mounting device.

1 Claim, 13 Drawing Sheets

(56) References Cited

U.S. PATENT DOCUMENTS

| | | | |
|---|---|---|---|
| 2006/0222479 A1* | 10/2006 | Shiwaku | B65G 1/0457 414/267 |
| 2012/0114453 A1* | 5/2012 | Ota | H01L 21/67736 414/281 |
| 2012/0263562 A1* | 10/2012 | Mizokawa | H01L 21/67736 414/618 |
| 2014/0003902 A1* | 1/2014 | Inui | B65G 1/0457 414/749.1 |
| 2015/0340258 A1* | 11/2015 | Hiyashi | H01L 21/67778 414/416.03 |
| 2018/0065806 A1* | 3/2018 | Sugahara | B25J 9/023 |

* cited by examiner

| OHT vibration | FOUP state | Abnormality determination |
|---|---|---|
| Large | Deteriorated | OHT and FOUP abnormal |
| Large | Good | Only OHT abnormal |
| Small | Deteriorated | Only FOUP abnormal |
| Small | Good | OHT and FOUP not abnormal |

TRANSFER ABNORMALITY DETECTION SYSTEM AND TRANSFER ABNORMALITY DETECTION METHOD

CROSS-REFERENCE TO RELATED APPLICATION

This application is based upon and claims the benefit of priority from Japanese Patent Application No. 2018-234178, filed on Dec. 14, 2018, the entire contents of which are incorporated herein by reference.

TECHNICAL FIELD

The present disclosure relates to a transfer abnormality detection system and a transfer abnormality detection method capable of detecting an abnormality that may occur when a container (transfer container) capable of storing transfer target objects such as wafers or the like is transferred by a transfer device.

BACKGROUND

In a semiconductor-manufacturing process, wafers are processed in a clean room to improve a yield and a quality. A storage pod (transfer container) called a FOUP (Front-Opening Unified Pod) is used to maintain an appropriate atmosphere around wafers. The wafers are accommodated in and managed by the FOUP. In such a semiconductor-manufacturing process, the FOUP containing the wafers is mounted in a highly clean internal space. A load port as a mounting device, which has a function of opening and closing a door of the FOUP (hereinafter referred to as "FOUP door") while making a close contact with the FOUP door, is provided adjacent to a wafer transfer chamber.

A process of transferring a FOUP containing unprocessed wafers to a load port as a mounting device or transferring a FOUP containing processed wafers from the mounting device to a predetermined position is performed by a container transfer device such as, for example, an OHT (Over Head Transport) or the like (see, e.g., Patent Document 1). The container transfer device may be provided with a part for detecting the vibration of the container transfer device itself during a process of transferring the FOUP. The failure or deterioration of the container transfer device may be determined early based on the detection information obtained by such a vibration detection part. This makes it possible to carry out appropriate maintenance.

PRIOR ART DOCUMENTS

Patent Documents

Patent Document 1: Japanese Patent Application Publication No. 2011-86733

However, when the container transfer device is traveling without transferring the FOUP, if the vibration detection part of the container transfer device detects an abnormal vibration, it may be determined that the cause of the abnormal vibration is the container transfer device itself. However, when an abnormal vibration is detected during a process of transferring the FOUP by the container transfer device, the cause of the abnormal vibration is not necessarily due to the failure of the container transfer device. Specifically, when the FOUP transferred by the container transfer device is deteriorated or deformed, the vibration generated during the transfer by the container transfer device may increase under the influence of the FOUP. For example, if the deformation of the FOUP progresses and the FOUP moves upward from the mounting table of the mounting device during the transfer of the FOUP by the container transfer device so that the FOUP is tilted due to the shift of the center of gravity of the FOUP, the vibration of the container transfer device may be increased and the vibration not occurring during normal transfer may be detected.

Since the vibration caused by the FOUP is added to the detection value obtained by the vibration detection part of the container transfer device itself under the influence of the deformation of the FOUP or the like, there is a problem that it is impossible to determine whether the abnormal vibration is detected due to the failure or deterioration of the container transfer device or whether the abnormal vibration is caused due to the deformation of the FOUP. In the related art, even if the container transfer device is abnormal due to the deformation or deterioration of the FOUP, the container transfer device as a whole is treated as being abnormal. Even if the abnormality is caused by the FOUP, the operation of the container transfer device is temporarily stopped to check the container transfer device.

SUMMARY

The present disclosure provides a transfer abnormality detection system and a transfer abnormality detection method capable of, when a detection value of a vibration detection part provided in a container transfer device is abnormal, specifying whether the abnormal vibration is caused by the transfer of a deformed or deteriorated transfer container or by the failure of the container transfer device itself. The present disclosure provides a technique capable of coping with a transfer container other than an FOUP, a container transfer device other than an OHT, and a mounting device other than a load port.

According to one embodiment of the present disclosure, there is provided a transfer abnormality detection system capable of receiving information from a container transfer device configured to transfer a transfer container accommodating a transfer target object along a predetermined path and a mounting device configured to load the transfer container that is transferred by the container transfer device, the system including: a determination part configured to: record which container transfer device is transferring the transfer container based on a container identification ID assigned to each transfer container and a transfer device identification ID assigned to each transfer device; and determine an abnormality in either or both of the container transfer device and the transfer container by combining vibration detection information of the container transfer device obtained by a vibration detection part provided in the container transfer device and state detection information of the transfer container obtained by a container state detection part provided in the mounting device.

As used herein, the term "container state detection part" may be any part capable of detecting the state of a transfer container mounted on a mounting device. Examples of the container state detection part may include a sensor for detecting a pressure of a gas (exhaust gas) exhausted from the inside of the transfer container to the outside of the transfer container through a port of the transfer container at the time of a purge process for replacing the inside of the transfer container with an appropriate gas such as a nitrogen gas or the like, a mapping sensor for detecting a wafer position in the transfer container, and the like. The deformation of the transfer container can be grasped from the value of the exhaust gas pressure sensor or the detection value of the mapping sensor. That is, when the value of the exhaust gas pressure sensor is lower than a previous value, it may be considered that the transfer container is deformed and the gas present in the transfer container is leaked to the outside through a deformed portion of the transfer container at the time of a purge process. In addition, when the detection value of the mapping sensor is different from a previous detection value (when wafer misalignment has occurred), it may be considered that the transfer container is deformed and the position of the wafer is changed. That is, the wafers contained in the transfer container are mounted on a multistage shelf provided in the transfer container. As the deformation of the transfer container progresses, the gap between the wafers in the height direction is changed. Therefore, by detecting such a change, it is possible to determine whether the transfer container is deformed. By detecting whether one wafer is inclined, it is possible to determine whether the transfer container is deformed.

In the transfer abnormality detection system according to the present invention, the transfer container identification ID given to the transfer container, the transfer device identification ID given to the transfer device, the container state detection information obtained by the container state detection part provided in the mounting device and the vibration detection information obtained by the vibration detection part provided in the transfer device are associated and preserved by the data-processing device. The deformation or deterioration of the transfer container can be specified based on the container state detection information obtained by the container state detection part provided in the mounting device. If the vibration of the transfer device is abnormal, by referring to the state of the transfer container, it is possible to determine and specify whether the abnormal vibration of the transfer device generated during the process of transferring the transfer container is a vibration caused by the transfer of a deformed or deteriorated transfer container or a vibration caused by the failure or deterioration of the transfer device itself. Furthermore, in the transfer abnormality detection system according to the present invention, when the abnormal vibration of the transfer device generated during the process of transferring the transfer container is a vibration caused by the deformation or deterioration of the transfer container, the cause of the abnormality can be eliminated by merely replacing the transfer container. This makes it possible to reduce the number of times of stopping the operation of all the related devices to specify a cause of an abnormal vibration. This also makes it possible to eliminate or alleviate a problem that the time, effort or cost is wasted.

According to another embodiment of the present disclosure, there is provided a transfer abnormality detection method for a transfer container implemented by using a transfer device configured to transfer a transfer container accommodating a transfer target object along a predetermined path, a mounting device configured to load the transfer container that is transferred by the transfer device, and a data-processing device capable of managing which transfer device is transferring the transfer container based on a container identifier assigned to each transfer container and a transfer device identifier assigned to each transfer device, the method including: determining, by a data-processing device, an abnormality in either or both of the transfer device and the transfer container by combining vibration information of the transfer device itself obtained by a vibration abnormality detection part provided in the transfer container and state information of the transfer container obtained by a container state detection part provided in the mounting device.

In such a transfer abnormality detection method according to the present invention, it is possible to obtain the same actions and effects as those of the transfer abnormality detection system. It is possible to quickly identify the cause of the abnormal vibration detected during the transfer of the transfer container by the transfer device. It is not necessary to stop the operation of all the related devices for abnormality check every time when abnormal vibration is detected. This also makes it possible to eliminate or alleviate a problem that the time, effort or cost is wasted.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a first embodiment of the present disclosure will be described with reference to the drawings.

Figure 1:
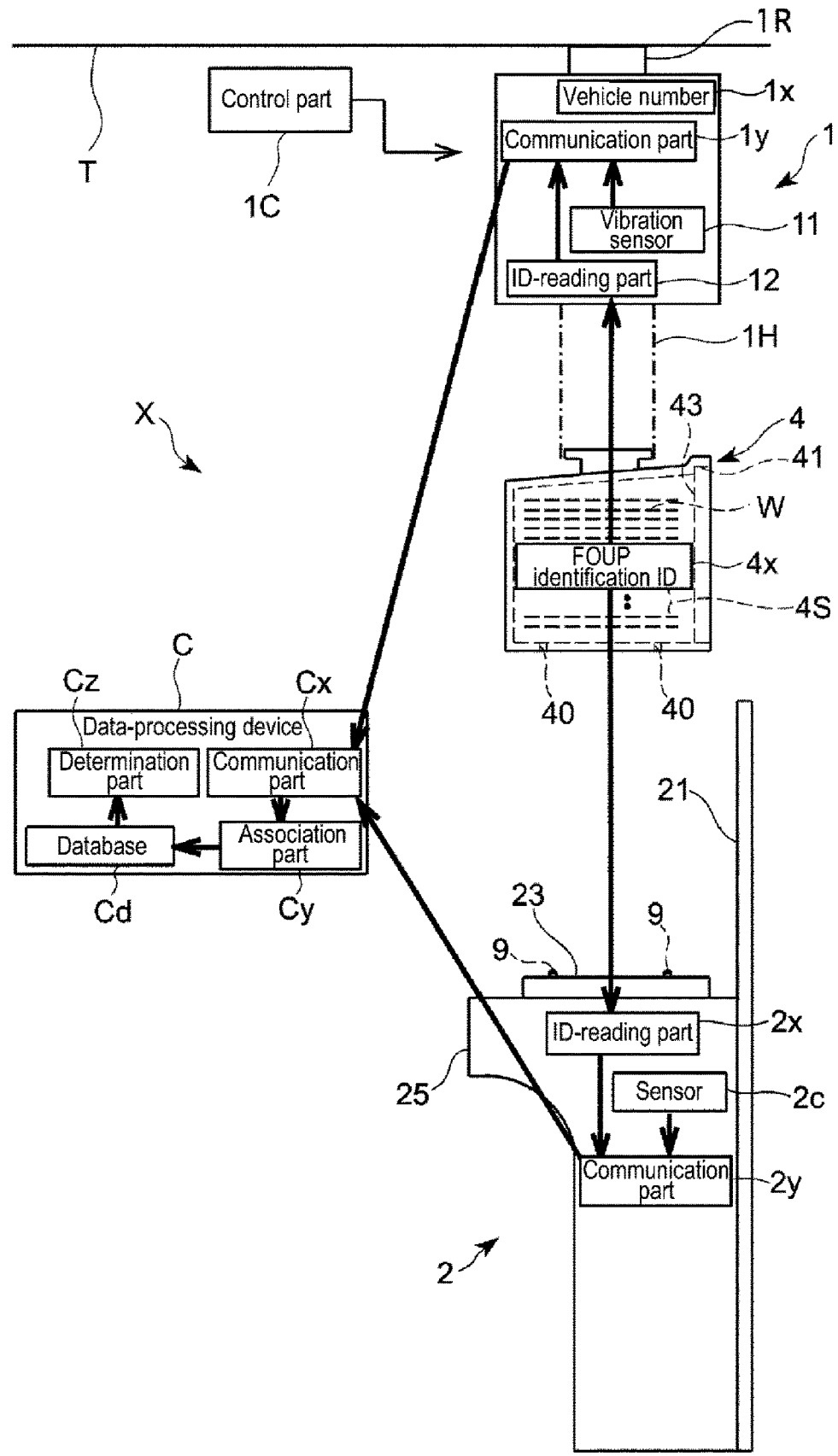
FIG. 1 is a block diagram of a transfer abnormality detection system according to an embodiment of the present disclosure.
Figure 2:
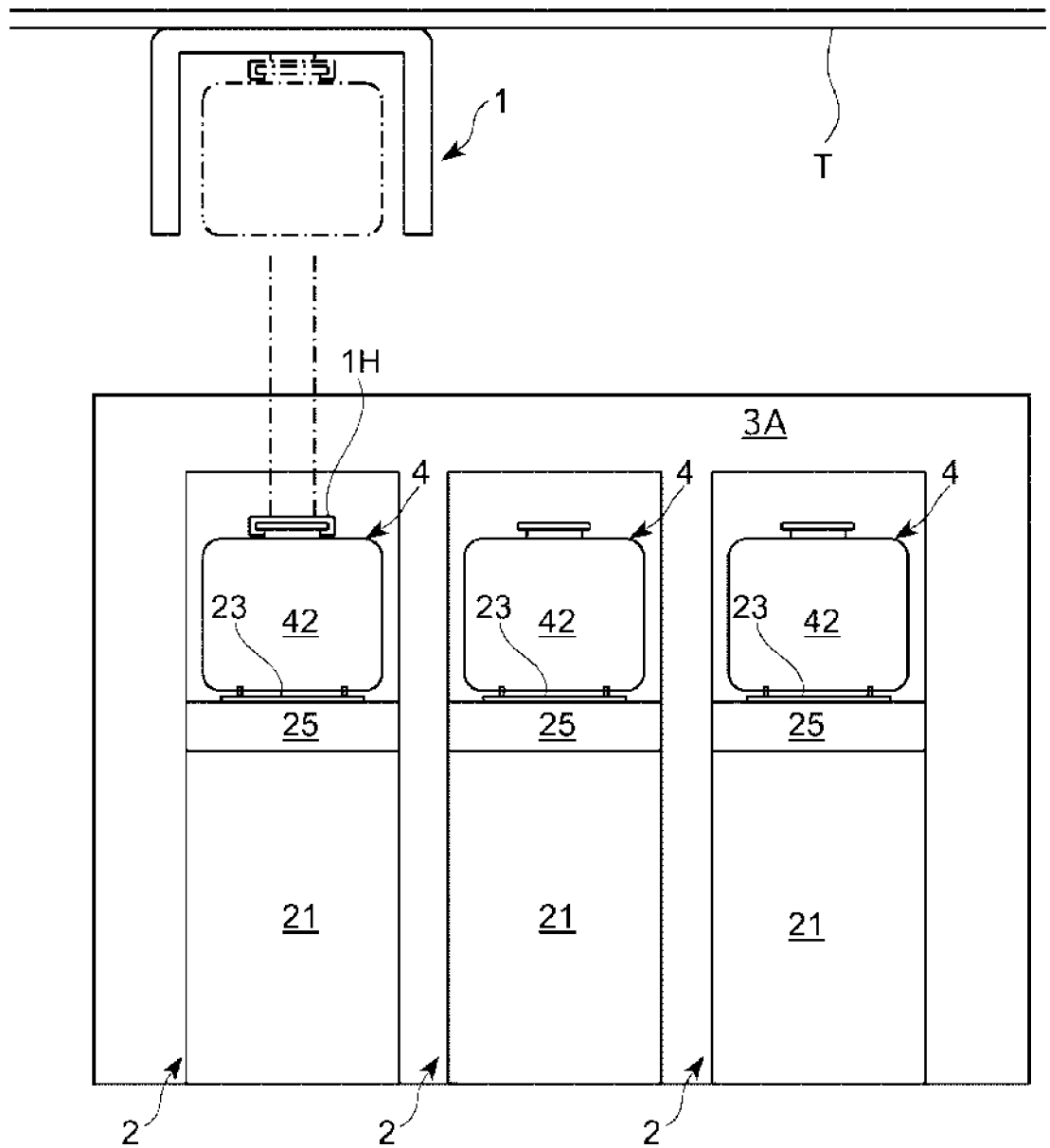
FIG. 2 is a front view schematically showing the relative positional relationship between an EFEM and its peripheral devices according to the embodiment.

For example, as shown in FIGS. 1 and 2, the transfer abnormality detection system X according to the present embodiment is configured by using a FOUP 4 which is a transfer container used in a semiconductor-manufacturing process, an OHT 1 (Over Head Transport: an unmanned transport vehicle of an overhead traveling type) which is a container transfer device capable of transferring the FOUP 4 along a predetermined path, a load port 2 which is a mounting device capable of loading the FOUP 4 that is transferred by the OHT 1, and a data-processing device C (the data-processing device C may be configured as a host system C including the same). Specifically, the transfer abnormality detection system X is a system which is applicable to a transfer abnormality detection method that goes through: a process of transmitting a container transfer device identification ID (vehicle number $1x$) associated with each OHT 1, a sensor value of a vibration sensor 11 provided in the OHT 1 and an ID $4x$ of an FOUP 4 (FOUP identification ID) read by a ID-reading part 12 provided in the OHT 1, to a data-processing device C from a communication part $1y$ of the OHT 1; a process of transmitting a detection value regarding a state of the FOUP 4 detected by a container state detection part $2c$ provided in a load port 2 (in the present embodiment, a sensor value regarding the FOUP 4 detected by a specific sensor $2c$ provided in the load port 2) and an ID $4x$ of the FOUP 4 read by an ID-reading part $2x$ provided in the load port 2, to the data-processing device C from a communication part $2y$ of the load port 2; and a process of, in the data-processing device C, associating and recording (making a database of) the container transfer device identification ID (vehicle number $1x$), the sensor value of the vibration sensor 11, the transfer container identification ID $4x$ and the sensor value of the specific sensor $2c$ provided in the load port 2 and determining whether the vibration is caused by the failure or deterioration of the OHT 1 or by the deformation or deterioration of the FOUP 4 when the vibration of the OHT 1 is larger or smaller than a reference.

Figure 3:
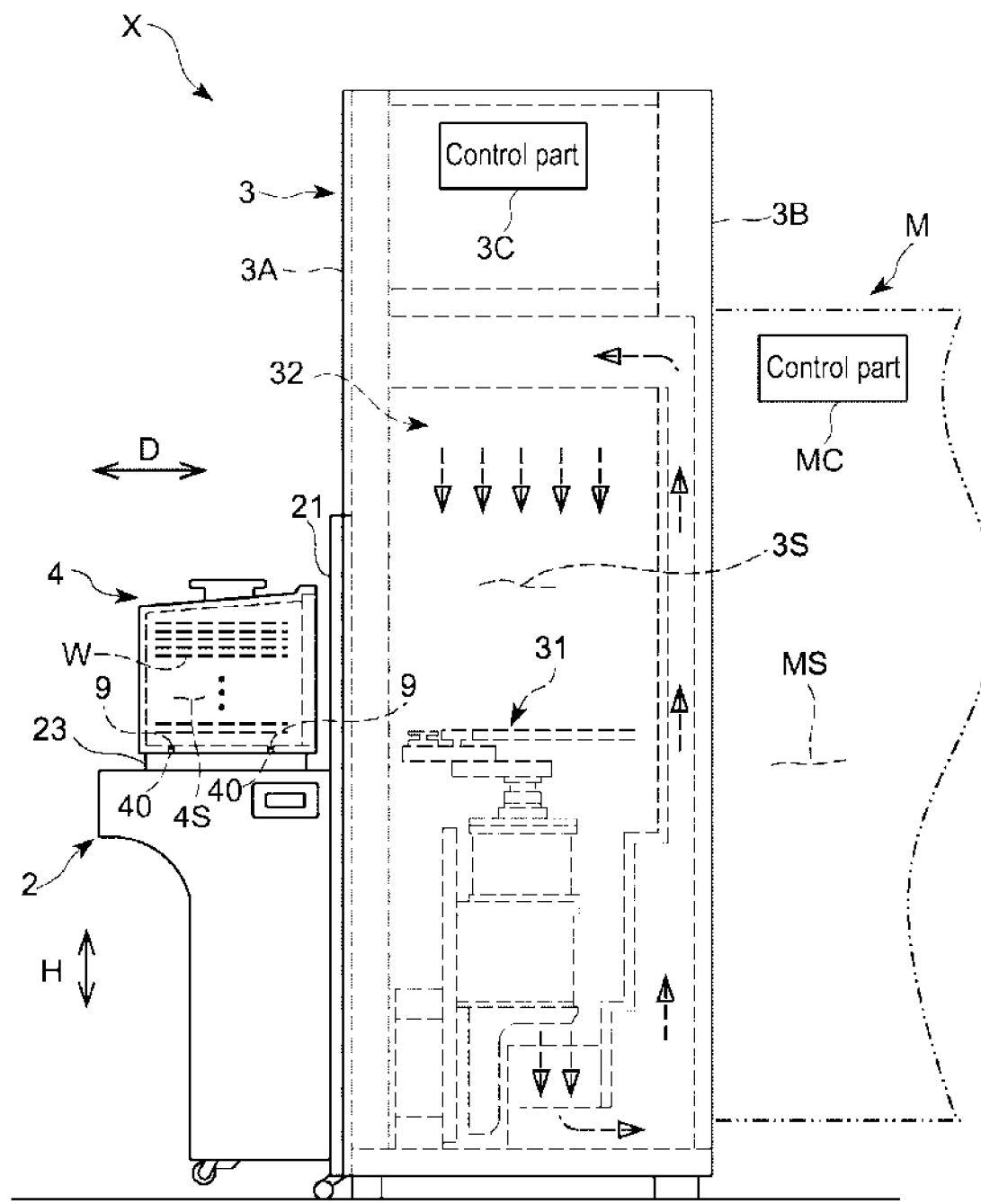
FIG. 3 is a side view schematically showing the relative positional relationship between the EFEM and its peripheral devices according to the embodiment.

As shown in FIG. 3, in the semiconductor-manufacturing process, the FOUP 4 is used together with an EFEM (Equipment Front End Module) including a load port 2 and a transfer chamber 3 disposed in a clean room. FIG. 3 schematically shows the relative positional relationship between the EFEM and its peripheral devices. In FIG. 1, the transfer chamber 3 is omitted.

In an internal space 3S of the transfer chamber 3, there is provided a transfer robot 31 capable of transferring a wafer W as a substrate between the FOUP 4 and a processing apparatus M. By driving a fan filter unit 32 provided in the transfer chamber 3, a descending gas flow may be generated in the internal space 3S of the transfer chamber 3, and a gas (environmental gas) having a high degree of cleanliness may be circulated in the internal space 3S. For example, a processing apparatus M (semiconductor-processing apparatus) is provided adjacent to a rear wall 3B of the transfer chamber 3 facing a front wall 3A where the load port 2 is disposed. In the clean room, the internal space MS of the processing apparatus M, the internal space 3S of the transfer chamber 3 and the internal space 4S of the FOUP 4 mounted on the load port 2 are maintained at a high degree of cleanliness. On the other hand, the space in which the load port 2 is disposed, in other words, the outside of the processing apparatus M or the outside of the EFEM, is maintained at a relatively low degree of cleanliness.

In the present embodiment, as shown in FIG. 3, the load port 2, the transfer chamber 3, and the processing apparatus M are sequentially disposed in close contact with each other in the front-rear direction D of the EFEM. The operation of the EFEM is controlled by a controller of the load port 2 (a control part 2C shown in FIG. 5) or a controller of the entire EFEM (a control part 3C shown in FIG. 3), and the operation of the processing apparatus M is controlled by a controller (a control part MC shown in FIG. 3) of the processing apparatus M. In this regard, the control part MC, which is a controller of the entire processing apparatus M, or the control part 3C, which is a controller of the entire EFEM, is a host controller of the control part 2C of the load port 2. The data-processing device C constituting the transfer abnormality detection system X is a host controller of the control part 2C of the load port 2. The data-processing device C is constituted by a server and may be communicably connected to a plurality of load ports 2 or OHTs 1 installed in a semiconductor-manufacturing process. Each of the control parts 2C, MC and 3C and the data-processing device C includes an ordinary microprocessor which includes a CPU, a memory and an interface, etc. Programs necessary for processing are pre-stored in the memory. The CPU sequentially takes out and executes necessary programs, and cooperates with peripheral hardware resources to realize desired functions.

Figure 4:
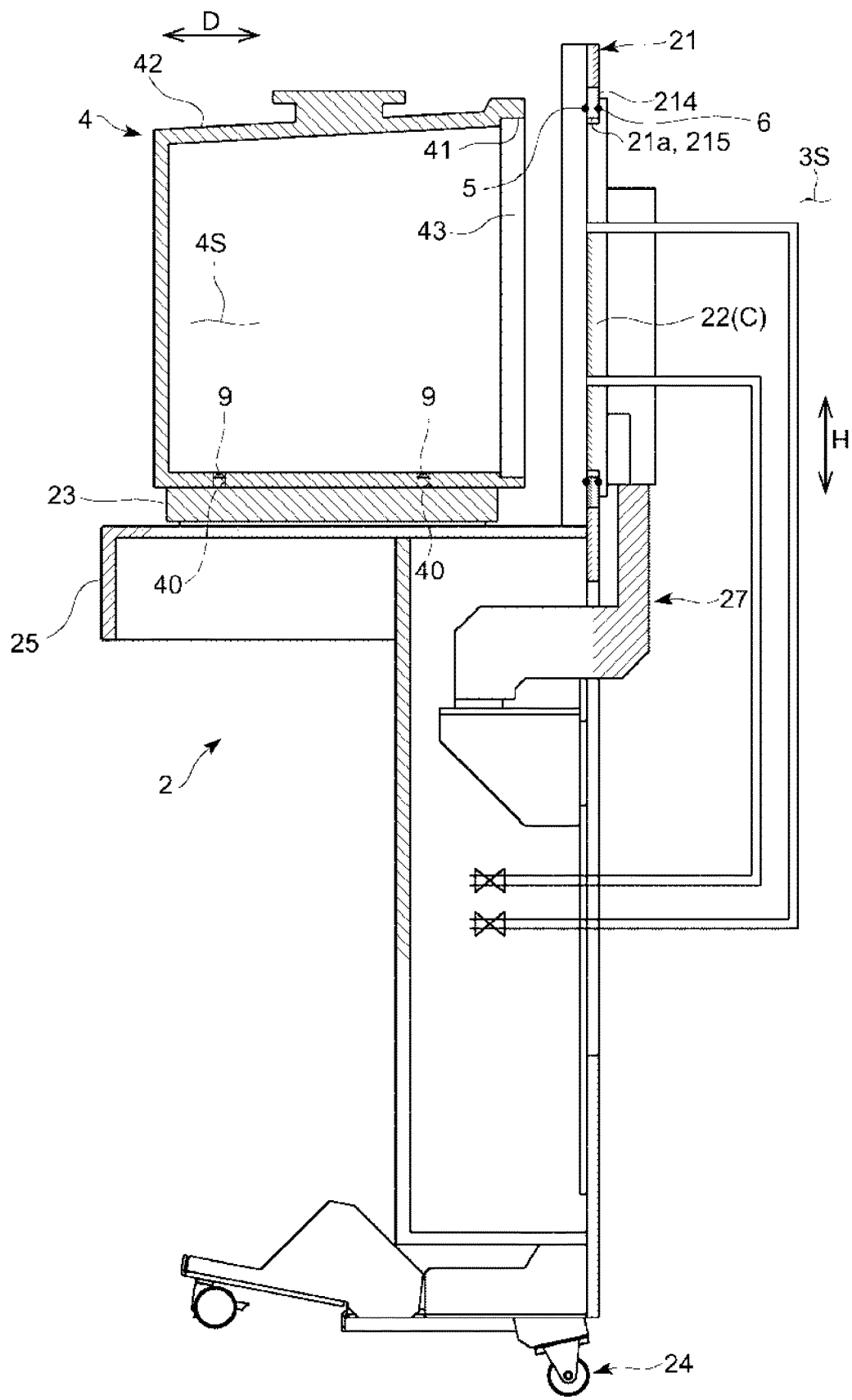
FIG. 4 is a view schematically showing a side cross section of a load port according to the embodiment, wherein an FOUP is separated from a base and a load port door is in a fully closed position.

As shown in FIGS. 3 and 4, the FOUP 4 includes a FOUP body 42 (transfer container body) having an internal space 4S that can be opened through a loading/unloading port 41 as an opening, and a FOUP door 43 (transfer container door) capable of opening and closing the loading/unloading port 41. The FOUP 4 is a known one configured to accommodate a plurality of wafers W in multiple stages in the vertical direction H and to allow the wafers W to be loaded or unloaded via the loading/unloading port 41.

The FOUP body 42 is provided with a shelf (wafer-mounting shelf) on which the wafers W can be mounted at a predetermined pitch in multiple stages in the internal space 4S. On the bottom wall of the FOUP body 42, as shown in FIG. 4 and the like, ports 40 are provided at predetermined locations. Each of the ports 40 mainly includes, for example, a hollow cylindrical grommet seal fitted into a port attachment through-hole formed in the bottom wall of the FOUP body 42, and is configured to be opened and closed by a check valve. At the center of the upwardly facing surface of the upper wall of the FOUP body 42, there is provided a flange portion held by the OHT 1.

The FOUP door 43 faces a load port door 22 of the load port 2 in a state in which the FOUP 4 is mounted on a below-described mounting table 23 of the load port 2, and has a substantially plate shape. The FOUP door 43 is provided with a latch key (not shown) capable of locking the FOUP door 43 to the FOUP body 42. A gasket (not shown) is provided on a predetermined portion of the FOUP door 43 that remains in contact with or in proximity to the FOUP body 42 in a state in which the loading/unloading port 41 is closed by the FOUP door 43. By bringing the gasket into contact with the FOUP body 42 and elastically deforming the gasket, it is possible to seal the internal space 4S of the FOUP 4.

In the FOUP 4 according to the present embodiment, as shown in FIGS. 1 and 2, an FOUP identification ID $4x$ as a transfer container identification ID $4x$ is attached to an appropriate place. In FIGS. 1 and 2, the FOUP identification ID $4x$ is schematically shown. Although an RFID (Radio Frequency Identifier) may be mentioned as an example of the FOUP identification ID 4x, the present disclosure is not limited thereto. An appropriate ID may be used. The FOUP identification ID 4x attached to the FOUP 4 may be a passive tag, an active tag, or a semi-active tag (actuated active tag) obtained by combining the passive tag and the active tag. The communication method is not particularly limited. Furthermore, as the FOUP identification ID 4x attached to the FOUP 4, it may also be possible to use a one-dimensional barcode, or a two-dimensional barcode such as a QR code (registered trademark) or the like. The FOUP 4 is transported in a factory by the OHT 1.

As schematically shown in FIGS. 1 and 2, the OHT 1 is an unmanned transfer vehicle including a hoist part 1H that moves up and down by belt drive and capable of accessing the load port 2 from the upper side. The OHT 1 transfers the FOUP 4 by traveling along a rail 1R (track) installed on a ceiling T in a factory in a state in which the FOUP 4 is lifted by the hoist part 1H. In the present embodiment, a plurality of load ports 2 is disposed along the rail 1R in a plan view. The FOUP 4 transferred by the OHT 1 may be mounted on the mounting table 23 of the load port 2, or the FOUP 4 on the mounting table 23 may be lifted and received by the OHT 1. The operation of the OHT 1 is controlled based on a command from the controller of the OHT 1 (the control part 1C shown in FIG. 1). The OHT 1 according to the present embodiment includes a vibration sensor 11 as a vibration detection part capable of detecting the vibration of the OHT 1 and a FOUP identification ID-reading part as a transfer container identification ID-reading part capable of reading the FOUP identification ID 4x attached to the FOUP 4. The OHT 1 further includes an OHT-side communication part 1y capable of transmitting, to the data-processing device C, the FOUP identification ID 4x read by the FOUP identification ID-reading part 12 and the information detected by the vibration sensor 11 (in the present embodiment, the sensor value (detection value) of the vibration sensor 11). Each of the vibration sensor 11, the FOUP identification ID-reading part 12 and the OHT-side communication part 1y is formed of a general-purpose product and is provided at a predetermined place of the OHT 1. The OHT 1 is assigned a unique vehicle number 1x which is a transfer device identification ID. The FOUP identification ID 4x read by the FOUP identification ID-reading part 12 and the detection information obtained by the vibration detection part (the sensor value of the vibration sensor 11) are associated with the vehicle number 1x and are transmitted to the data-processing device C by the OHT-side communication part 1y.

In addition, an OHS (Over Head Shuttle: Overhead traveling shuttle), a RGV (Rail Guided Vehicle: Tracked unmanned vehicle), an AGV (Automated Guided Vehicle: Unmanned transport vehicle) or the like may be used as the container transfer device instead of the OHT. The RGV and the AGV are container transfer devices that travel on a floor surface in a factory. If the container transfer device is the RGV, the rail (track) is installed on the floor of the factory.

As shown in FIGS. 4 to 7 and the like, the load port 2 according to the present embodiment includes a plate-like base 21 constituting a part of the front wall 3A of the transfer chamber 3 and having an opening 21a for opening the internal space 3S of the transfer chamber 3, a load port door 22 (mounting device door) configured to open and close the opening 21a of the base 21, and a mounting table 23 provided on the base 21 in a substantially horizontal posture.

Figure 8:
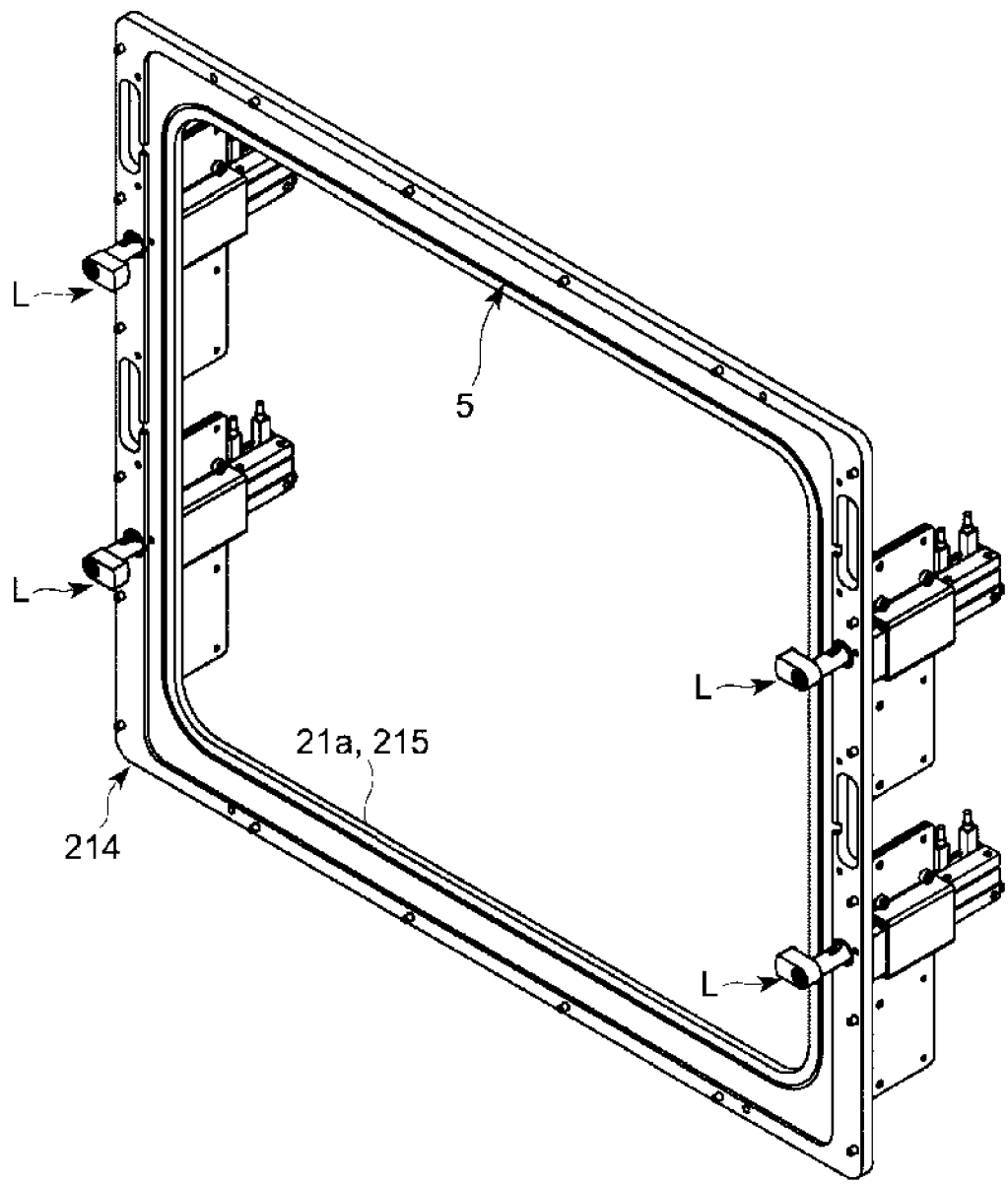
FIG. 8 is an overall perspective view of a window unit according to the embodiment.

At the lower end of the base 21, there is provided a leg part 24 including a caster and an installation leg. A window unit 214 (see FIG. 8) is provided at a position facing the FOUP door 43. An opening 215 formed at the window unit 214 is an opening that allows the wafer W to pass therethrough.

Figure 5:
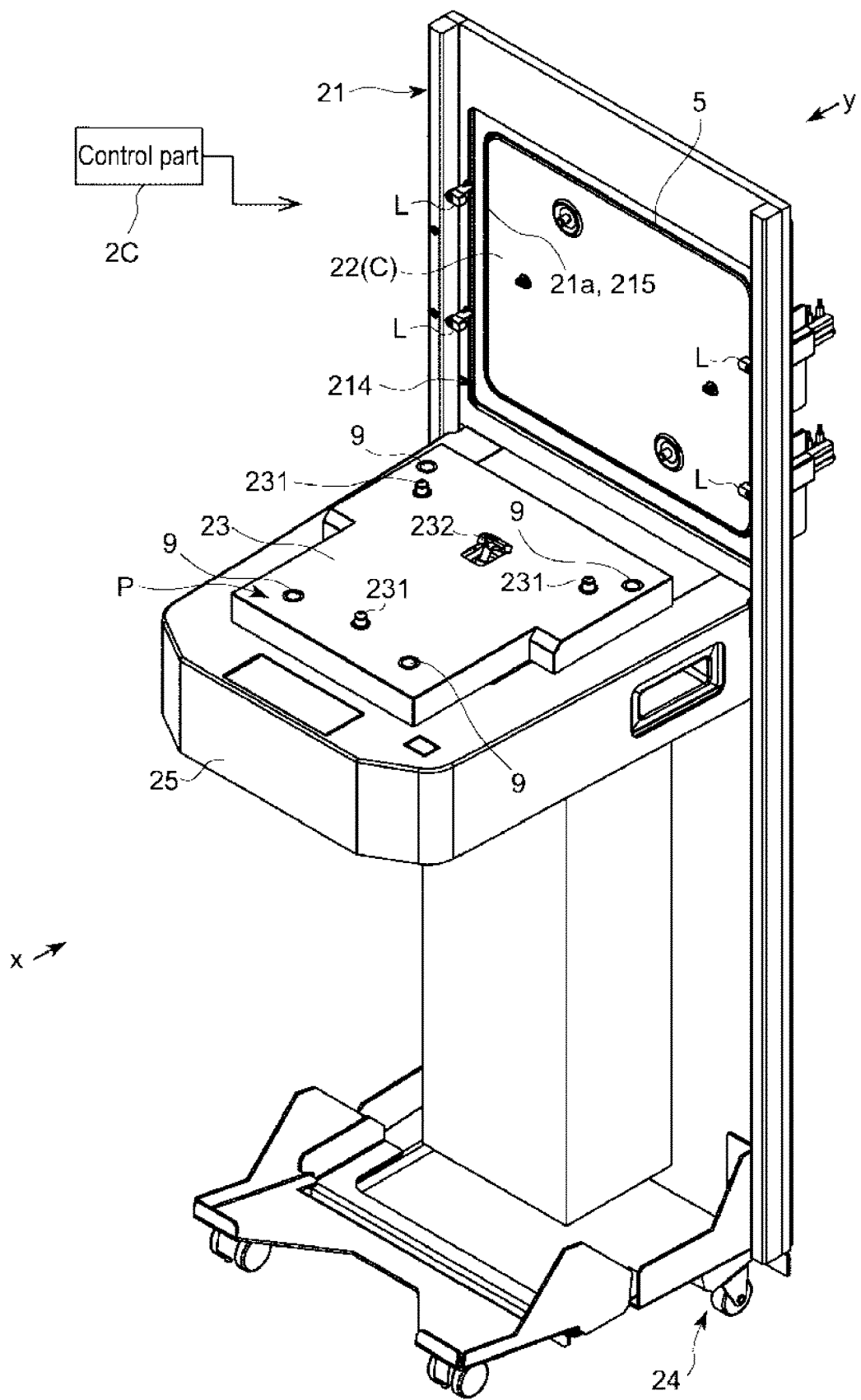
FIG. 5 is a perspective view showing a load port according to the embodiment with a part thereof omitted.
Figure 6:
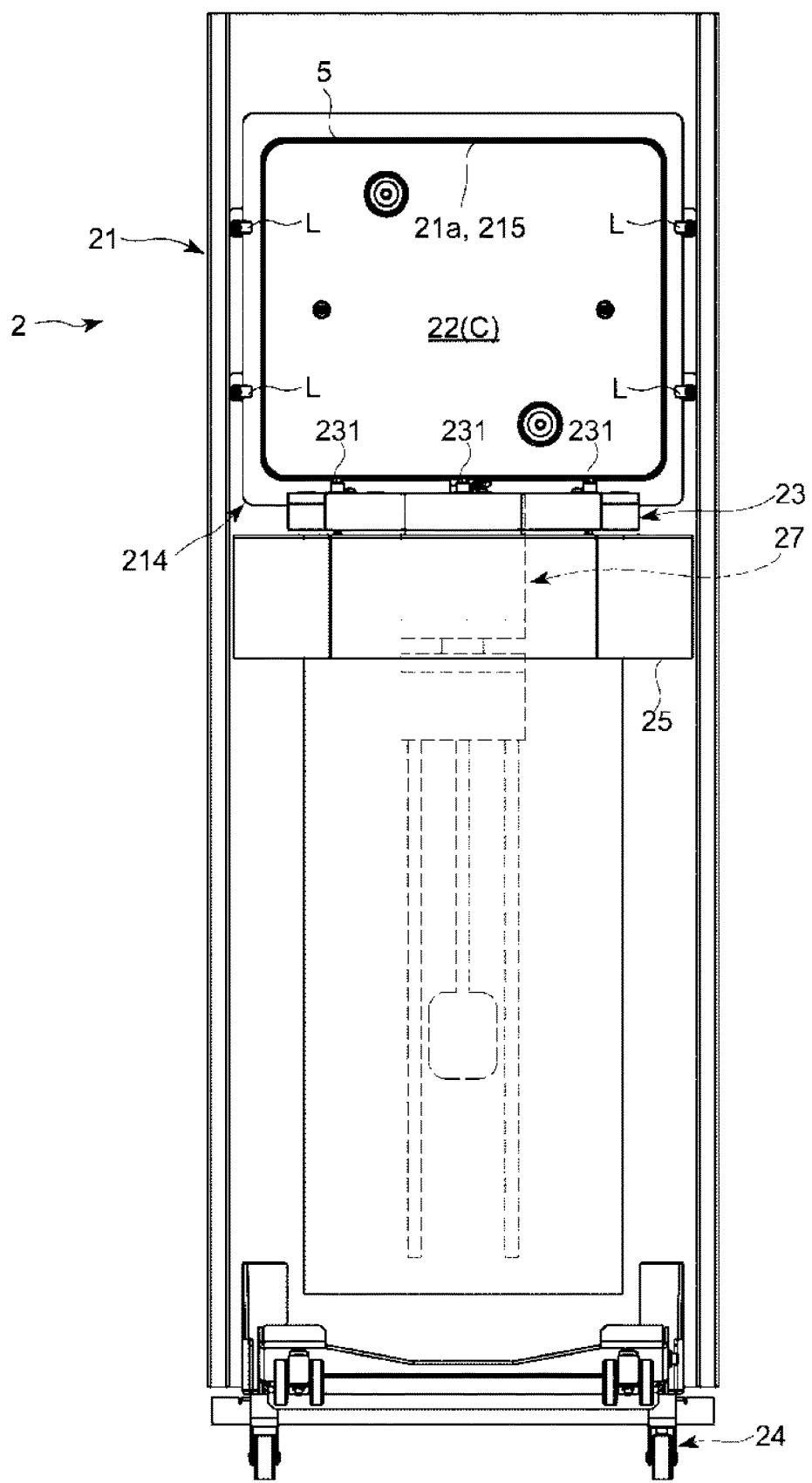
FIG. 6 is a view in the direction of an arrow x in FIG. 5.
Figure 7:
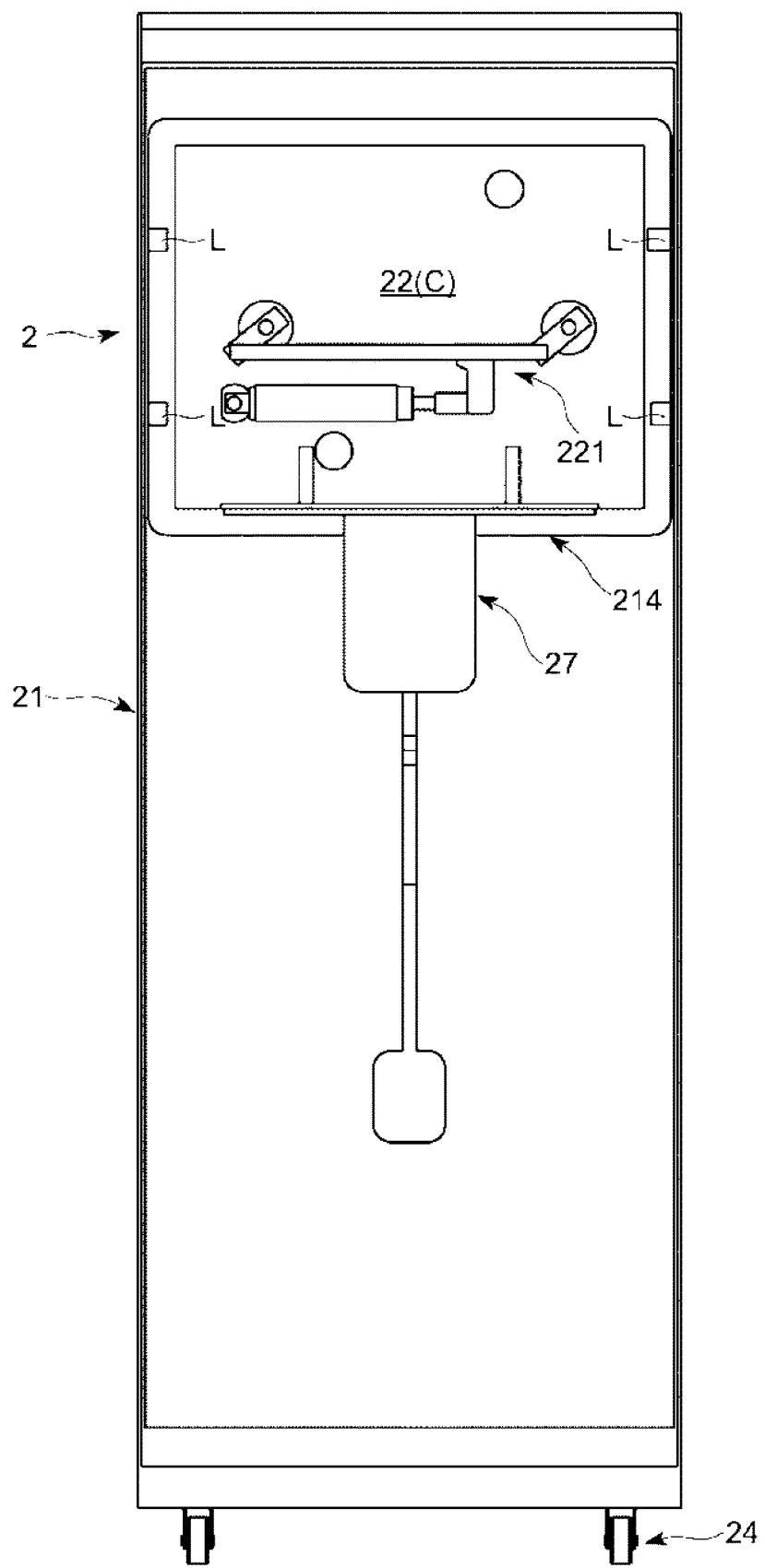
FIG. 7 is a view in the direction of an arrow y in FIG. 5.

The mounting table 23 is provided at an upper portion of a horizontal base 25 (support) which is disposed in a substantially horizontal posture at a position slightly above a center of the base 21 in the height-direction. The mounting table 23 is capable of mounting the FOUP 4 in a direction in which the FOUP door 43, which can open and close the internal space 4S of the FOUP body 42, faces the load port door 22. Furthermore, the mounting table 23 is configured to be movable forward and backward with respect to the base 21 between a predetermined docking position (see FIG. 9) at which the FOUP door 43 is close to the opening 21a of the base 21 and a position (see FIG. 4) at which the FOUP door 43 is spaced apart by a predetermined distance from the base 21 as compared with the docking position. As shown in FIG. 5, the mounting table 23 includes a plurality of protrusions (pins) 231 protruding upward. By bringing these protrusions 231 into engagement with holes (not shown) formed on the bottom surface of the FOUP 4, it is possible to perform the positioning of the FOUP 4 over the mounting table 23. In addition, there is provided a lock claw 232 for fixing the FOUP 4 to the mounting table 23. By establishing a lock state in which the lock claw 232 is hooked and fixed to a locked portion (not shown) provided at the bottom surface of the FOUP 4, it is possible to fix the FOUP 4 while guiding the FOUP 4 to a proper position over the mounting table 23 in cooperation with the positioning protrusions 231. In addition, by releasing the lock state of the lock claw 232 to the locked portion provided at the bottom surface of the FOUP 4, it is possible to establish a state in which the FOUP 4 can be spaced apart from the mounting table 23.

The load port door 22 includes a connection mechanism 221 (see FIG. 7) that can be switched between a lid connection state in which the connection mechanism 221 is connected to the FOUP door 43 to remove the FOUP door 43 from the FOUP body 42 and a lid connection release state in which the connection to the FOUP door 43 is released to attach the FOUP door 43 to the FOUP body 42. The load port door 22 is movable along a predetermined movement path while integrally holding the FOUP door 43 by the connection mechanism 221. The load port 2 of the present embodiment is configured so that the load port door 22 can be moved at least between a position shown in FIG. 9, i.e., a fully closed position (C) at which the internal space 4S of the FOUP body 42 is sealed by the FOUP door 43 held by the load port door 22, and a position shown in FIG. 10, i.e., an open position (O) at which the FOUP door 43 held by the load port door 22 is spaced apart from the FOUP body 42 to open the internal space 4S of the FOUP body 42 toward the inside of the transfer chamber 3. The load port 2 of the present embodiment is configured so that the load port door 22 located at the fully closed position (C) can be moved to the open position (O) shown in FIG. 10 while maintaining the upright posture of the load port door 22 and so that the load port door 22 can be moved downward from the open position (O) shown in FIG. 10 to a fully opened position (not shown) while maintaining the upright posture of the load port door 22. Such movement of the load port door 22 is realized by a door-moving mechanism 27 provided in the load port 2. Furthermore, the load port 2 of the present embodiment includes a movement-restraining part L which restrains the FOUP 4 over the mounting table 23 located at the docking position from moving in the direction in which the FOUP 4 is spaced apart from the base 21. In the present embodiment, the movement-restraining part L is unitized as the window unit 214 (see FIG. 8).

The load port 2 of the present embodiment includes a purge device P that can inject a purge gas (mainly a nitrogen gas or a dry air) into the internal space 4S of the FOUP 4 and can replace a gas atmosphere in the internal space 4S of the FOUP 4 with the purge gas (see FIG. 5). The purge device P includes a plurality of purge nozzles 9 (gas supply/discharge devices) disposed at predetermined locations on the mounting table 23 in a state in which the upper end portions thereof can be exposed. These purge nozzles 9 are attached to appropriate positions over the mounting table 23 in a corresponding relationship with the positions of the ports 40 provided at the bottom surface of the FOUP 4 and can be connected to the ports 40 in contact with the ports 40. The bottom purge process using such a purge device P is a process that fills the inside of the FOUP 4 with a purge gas by allowing a predetermined number (excluding all) of the plurality of ports 40 provided at the bottom of the FOUP 4 to function as "supply ports," injecting an appropriate selected purge gas such as nitrogen gas, an inert gas or a dry air into the FOUP 4 by the purge nozzles 9 connected to the supply ports, allowing the remaining port 40 to function as an "exhaust port," and discharging the gas atmosphere in the FOUP 4 through the purge nozzle 9 connected to the exhaust port. The load port 2 includes a pressure sensor (not shown) that detects the gas pressure (exhaust pressure) in the purge nozzle 9 connected to the port 40 functioning as the exhaust port at the time of bottom purge processing.

Figure 11:
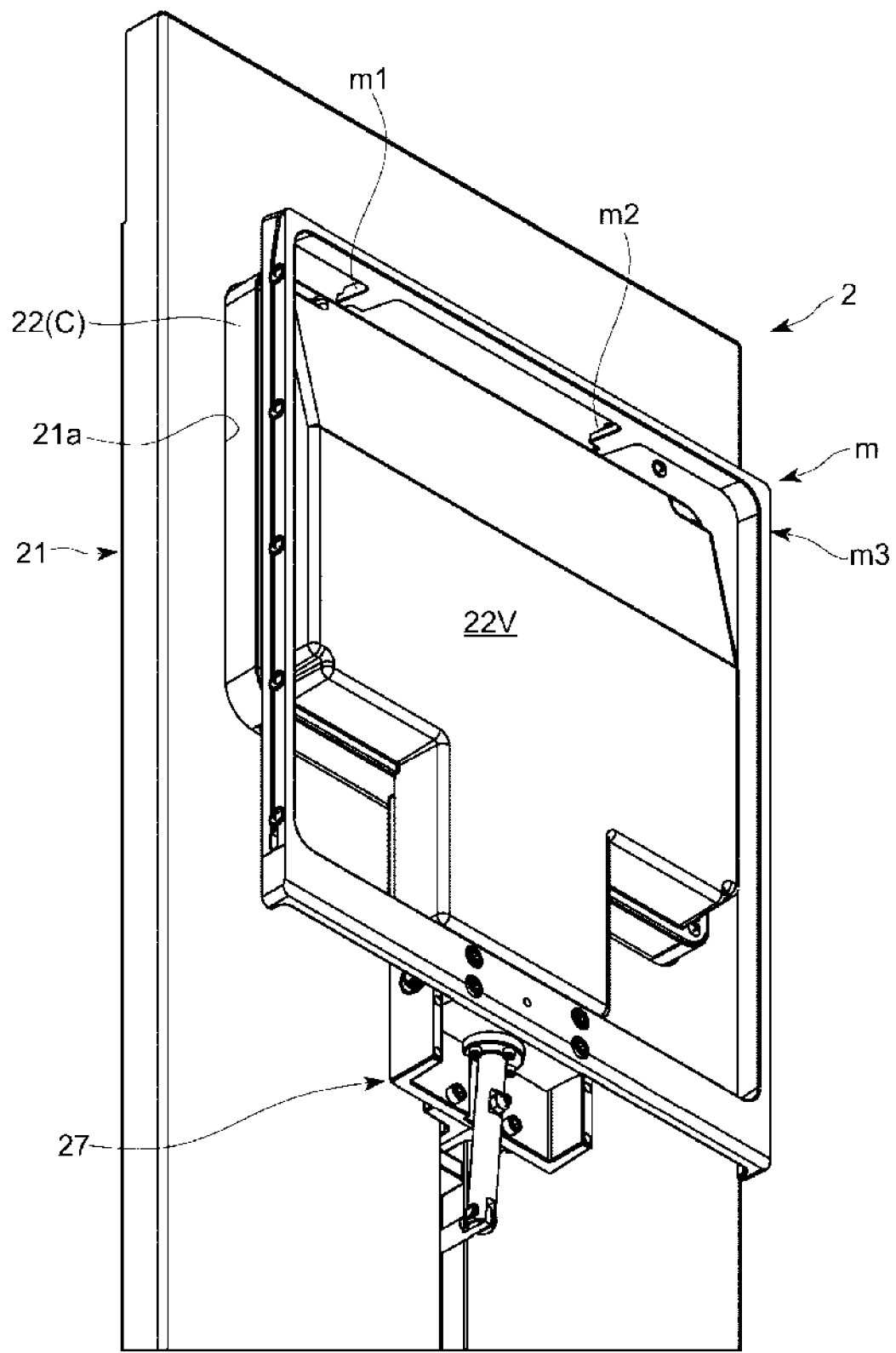
FIG. 11 is a view showing a mapping part according to the embodiment.

As shown in FIG. 11, the load port 2 of the present embodiment includes a mapping part m capable of detecting the presence or absence of wafers W in the FOUP 4 or the storage posture of the wafers W. The mapping part m includes a mapping sensor (including a transmitter m1 and a receiver m2) capable of detecting the presence or absence of wafers W stored in multiple stages in the height direction H inside the FOUP 4, and a sensor frame m3 that supports the mapping sensor m1 and m2. The mapping part m is capable of being switched between a mapping retraction posture in which the mapping part m as a whole is disposed in the transfer space inside the transfer chamber and a mapping posture in which at least the mapping sensor m1 and m2 is positioned inside the FOUP 4 through the opening 21*a* of the base 21. The mapping part m is configured to be movable in the height direction H while maintaining the mapping retraction posture or the mapping posture. As shown in FIG. 11, a part of the sensor frame m3 is attached to a part of the door-moving mechanism 27, whereby the vertical movement of the mapping part m is performed together with the vertical movement of the load port door 22. In addition, the mapping part m is omitted in respective figures other than FIG. 11.

The mapping sensor includes a transmitter m1 (light emission sensor) that emits a beam (ray) as a signal, and a receiver m2 (light reception sensor) that receives the signal emitted from the transmitter m1. Alternatively, the mapping sensor may include a transmitter and a reflector that reflects the ray emitted from the transmitter toward the transmitter. In this case, the transmitter also serves as a receiver.

As shown in FIGS. 1 and 2, the load port 2 according to the present embodiment includes an FOUP identification ID-reading part 2*x* (transfer container identification ID-reading part) capable of reading the FOUP identification ID 4*x* attached to the FOUP 4, and a load port communication part 2*y* capable of transmitting the FOUP identification ID 4*x* read by the FOUP identification ID-reading part 2*x* and the detection values (sensor values) of the sensors 2*c* (two types of sensors including a pressure sensor and a mapping sensor in the present embodiment) that directly or indirectly detect the state of the FOUP 4, to the data-processing device C. Each of the FOUP identification ID-reading part 2*x*, the pressure sensor, the mapping sensor and the load port communication part 2*y* is formed of a general-purpose product and is provided at a predetermined location in the load port 2.

As shown in FIGS. 1 and 2, the data-processing device C includes a data-processing device-side communication part Cx and a determination part Cz. The data-processing device-side communication part Cx is capable of receiving the FOUP identification ID 4*x* transmitted from the load port-side communication part 2*y* and the detection information obtained by the state detection part (the sensor value of the specific sensor 2*c* in the present embodiment), or the FOUP identification ID 4*x* associated with the vehicle number 1*x* transmitted from the OHT-side communication part 1*y* and the detection information obtained by the vibration detection part (the sensor value of the vibration sensor 11 in the present embodiment). The determination part Cz is configured to determine an abnormality of one or both of the OHT 1 and the FOUP 4 based on the information received by the data-processing device-side communication part Cx (the FOUP identification ID 4*x*, the detection information regarding the state of FOUP 4 (in the present embodiment, the sensor value of the specific sensor 2*c*), the vehicle number 1*x*, the vibration information of the OHT (in the present embodiment, the sensor value of the vibration sensor 11)). The data-processing device C includes an association part Cy for mutually associating the FOUP identification ID 4*x*, the vehicle number 1*x* of the OHT 1 and the sensor values (the sensor values of the pressure sensor, the mapping sensor and the vibration sensor 11) received by the data-processing device-side communication part Cx, and a database Cd for storing and accumulating (preserving and recording) the data associated by the association part Cy. The determination part Cz is configured to determine an abnormality of one or both of the OHT 1 and the FOUP 4 based on the data stored in the database Cd. Each of the data-processing device-side communication part Cx, the association part Cy, the database Cd and the determination part Cz may be configured using a general-purpose product. The data-processing device C records and manages which OHT 1 is transferring the FOUP 4 currently transported by the OHT 1 based on the ID 4*x* assigned to each FOUP 4 and the ID 1*x* assigned to each OHT 1. Specific processing contents in the determination part Cz of the data-processing device C will be described below.

Next, the operation flow of the transfer abnormality detection system X according to the present embodiment will be described along with the operation flow of the EFEM.

First, the OHT 1 as a container transfer device moves along the rail 1R while holding and lifting the FOUP 4. The OHT 1 stops moving when the FOUP 4 is positioned above the mounting table 23 of the load port 2. The OHT 1 mounts the FOUP 4 over the mounting table 23. At this time, for example, the positioning protrusions 231 provided on the mounting table 23 are fitted into the positioning recesses of the FOUP 4, and the lock claw 232 on the mounting table 23 is brought into a locked state (locking process). In the present embodiment, the FOUP 4 may be mounted on each of the mounting tables 23 of three load ports 2 arranged side by side in the width direction of the transfer chamber 3. Furthermore, the mounting of the FOUP 4 at a regular position over the mounting table 23 is detected by a seating sensor (not shown) for detecting whether or not the FOUP 4 is mounted at a predetermined position over the mounting table 23.

In the load port 2 of the present embodiment, when the FOUP 4 is mounted at the regular position over the mounting table 23, the seating sensor detects that the bottom surface portion of the FOUP 4 presses the pressed portion of, for example, a pressure sensor provided on the mounting table 23. In response to this, the purge nozzles 9 (all the purge nozzles 9) provided on the mounting table 23 are moved upward beyond the upper surface of the mounting table 23 and are connected to the ports 40 of the FOUP 4, whereby the ports 40 are switched from the closed state to the open state. Then, the load port 2 of the present embodiment performs a process (bottom purge process) in which a nitrogen gas is supplied to the internal space 4S of the FOUP 4 by the purge device P to replace the internal space 4S of the FOUP 4 with the nitrogen gas. During the bottom purge process, the gas atmosphere in the FOUP 4 is exhausted to the outside of the FOUP 4 from the purge nozzle 9 connected to the port 40 functioning as an exhaust port. By virtue of such a bottom purge process, the moisture concentration and the oxygen concentration in the FOUP 4 are reduced to predetermined values or lower, respectively, whereby the ambient environment of the wafers W in the FOUP 4 is converted to a low humidity environment and a low oxygen environment.

Figure 9:
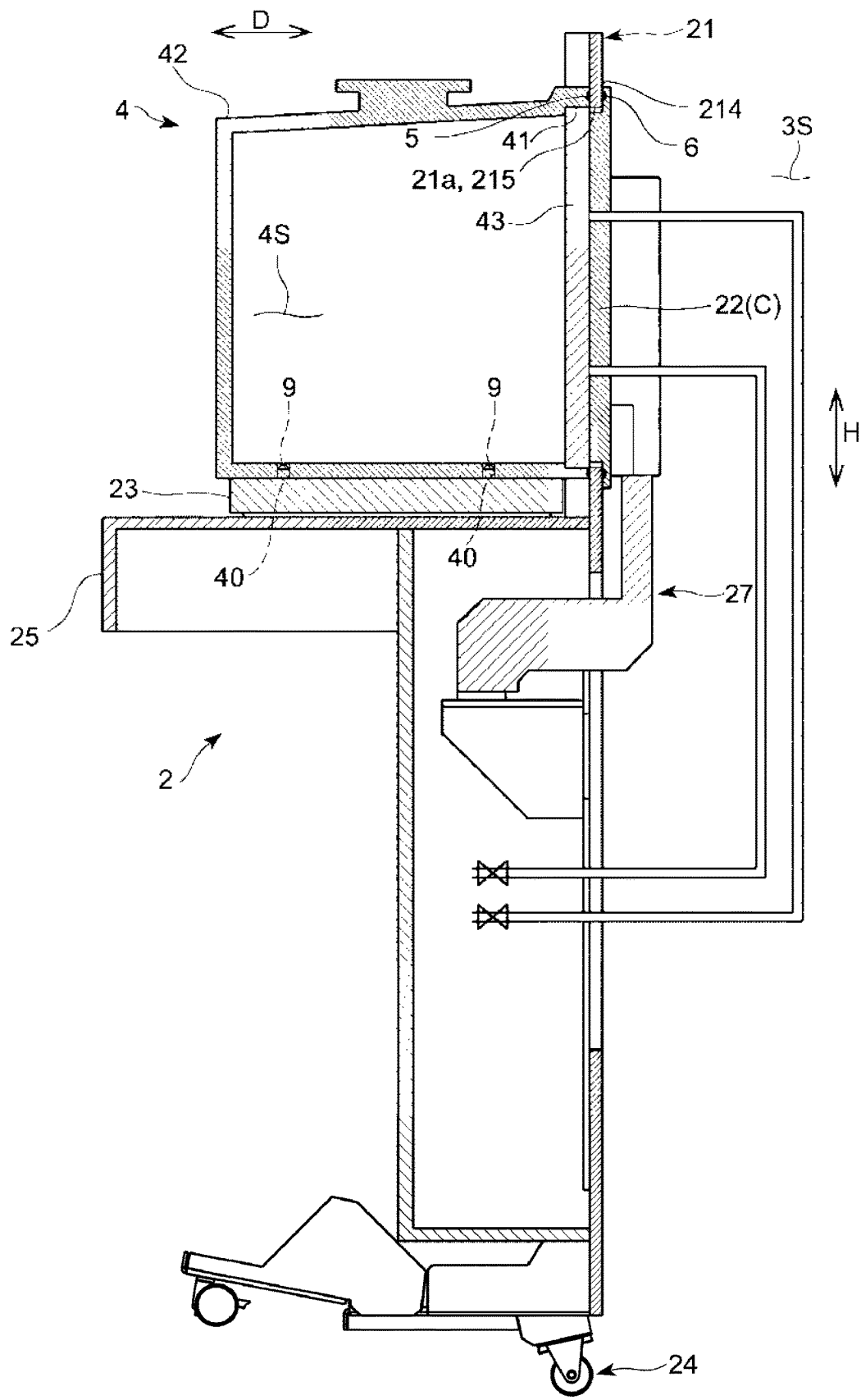
FIG. 9 is a view corresponding to FIG. 4 and showing a state in which the FOUP comes close to the base and the load port door is in the fully closed position.
Figure 10:
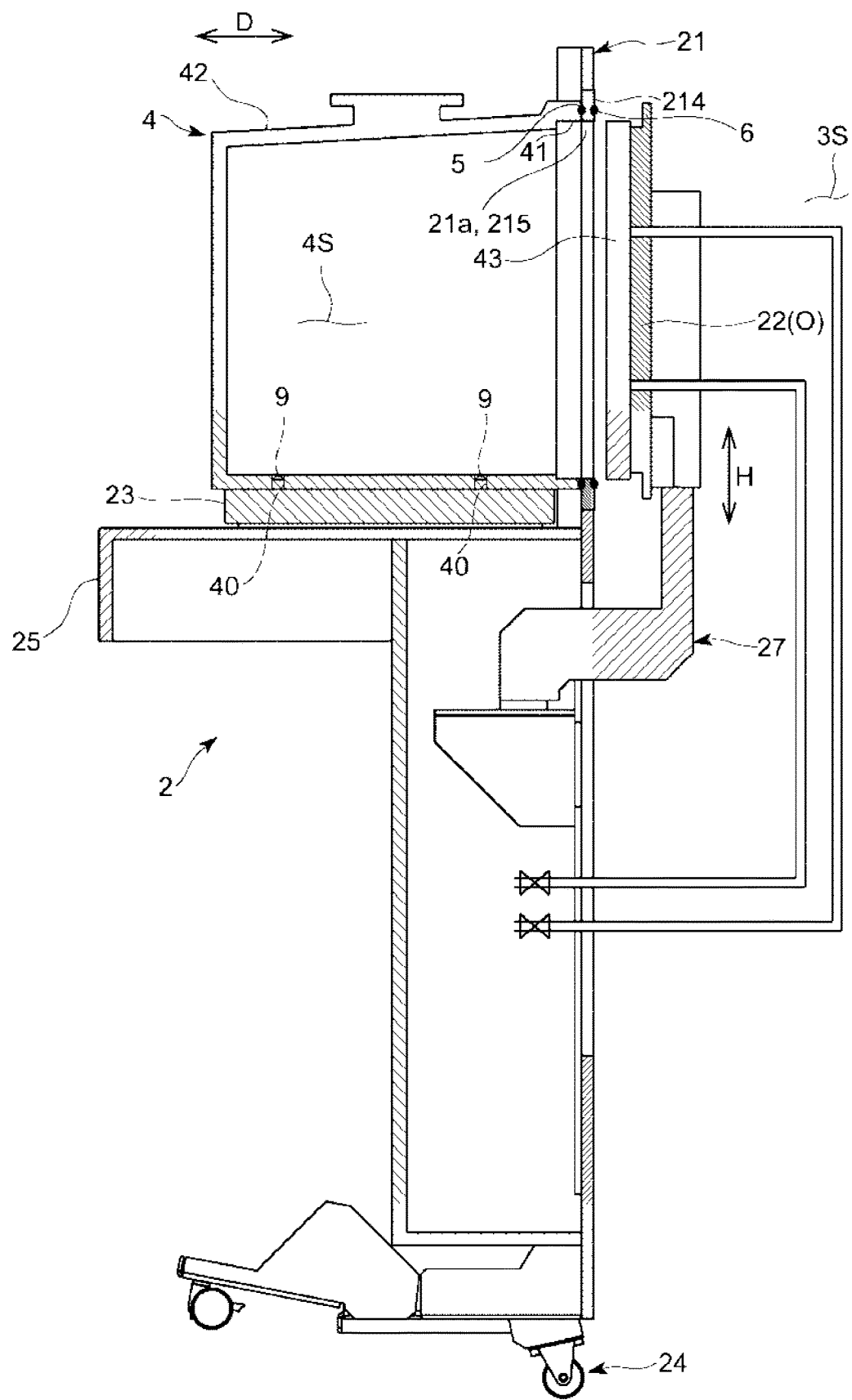
FIG. 10 is a view corresponding to FIG. 4 and showing a state in which the load port door is in an open position.

After the locking process, the load port 2 of the present embodiment performs a process of moving the mounting table 23 existing at the position shown in FIG. 4 to the docking position shown in FIG. 9 (docking process), a process of holding and fixing at least both sides of the FOUP 4 through the use of the movement-restraining part L (clamping process), a process of switching the connection mechanism 221 to the lid connection state (lid-connecting process), and a process of releasing the sealed state of the FOUP 4 by moving the FOUP door 43 together with the load port door 22 to open the opening 21a of the base 21 and the loading/unloading port 41 of the FOUP 4 (sealing-releasing process). The load port 2 of the present embodiment performs a mapping process through the use of the mapping part m during the process of moving the load port door 22 from the open position (O) to the fully opened position. The mapping process is a process in which the mapping part m having kept in the mapping retraction posture until immediately before performing the sealing-releasing process is switched to the mapping posture after the load port door 22 is moved from the fully closed position (C) to the open position (O), the load port door 22 is moved downward toward the fully opened position, the mapping part m is also moved downward while maintaining the mapping posture, and the presence or absence and the storage posture of the wafers W stored in the FOUP 4 are detected using the mapping sensor m1 and m2. That is to say, the signal path formed between the transmitter m1 and the receiver m2 by transmitting a signal from the transmitter m1 to the receiver m2 is interrupted at a location where the wafer W exists, and is not interrupted at a location where the wafer W does not exist, so that the signal reaches the receiver m2. Thus, the presence or absence and the storage posture of the wafers W stored side by side in the height direction H inside the FOUP 4 can be sequentially detected.

By performing the sealing-releasing process, the internal space 4S of the FOUP body 42 and the internal space 3S of the transfer chamber 3 are in communication with each other. Based on the information (wafer position) detected in the mapping process, the transfer robot 31 provided in the internal space 3S of the transfer chamber 3 performs a process of taking out the wafer W from a specific wafer placement shelf, or storing the wafer W in a specific wafer placement shelf (transfer process).

When all the wafers W in the FOUP 4 have been processed by the processing apparatus M, the load port 2 according to the present embodiment performs a process of sealing the internal space 4S of the FOUP 4 by moving the load port door 22 to the fully closed position (C) through the use of the door-moving mechanism 27 to close the opening 21a of the base 21 and the loading/unloading port 41 of the FOUP 4 (sealing process), and then performs a process of switching the connection mechanism 221 from the lid connection state to the lid connection release state (lid-connection-releasing process). By virtue of this process, the FOUP door 43 can be attached to the FOUP body 42. The opening 21a of the base 21 and the loading/unloading port 41 of the FOUP 4 are closed by the load port door 22 and the FOUP door 43, respectively. Thus, the internal space 4S of the FOUP 4 comes into a sealed state.

Subsequently, the load port 2 according to the present embodiment performs a clamp-releasing process of releasing the fixed state (clamped state) of the FOUP 4 caused by the movement-restraining part L, and then performs a process of moving the mounting table 23 in a direction away from the base 21 (undocking process). Thereafter, the load port 2 releases the state in which the FOUP 4 is locked by the lock claw 232 on the mounting table 23 (unlocking process). As a result, the FOUP 4 that stores the wafers W for which predetermined processing has been completed is delivered from the top of the mounting table 23 of each load port 2 to the OHT 1 and is carried out to the next process.

In the course of performing the above process, the transfer abnormality detection system X according to the present embodiment transfers the FOUP 4 along the rail 4R by the OHT 1. The vibration sensor 11 provided in the OHT 1 detects the vibration of the OHT 1 during the transfer at a predetermined timing before the FOUP 4 is delivered from the OHT 1 to the load port 2. The FOUP identification ID-reading part 12 of the OHT 1 reads the FOUP identification ID 4x of the FOUP 4. Then, the sensor value of the vibration sensor 11 and the read FOUP identification ID 4x are associated with the vehicle ID number 1x as an identification ID attached to each OHT 1 and are transmitted to the data-processing device C (the communication part Cx of the data-processing device C) by the OHT-side communication part 1y.

Figure 12A:
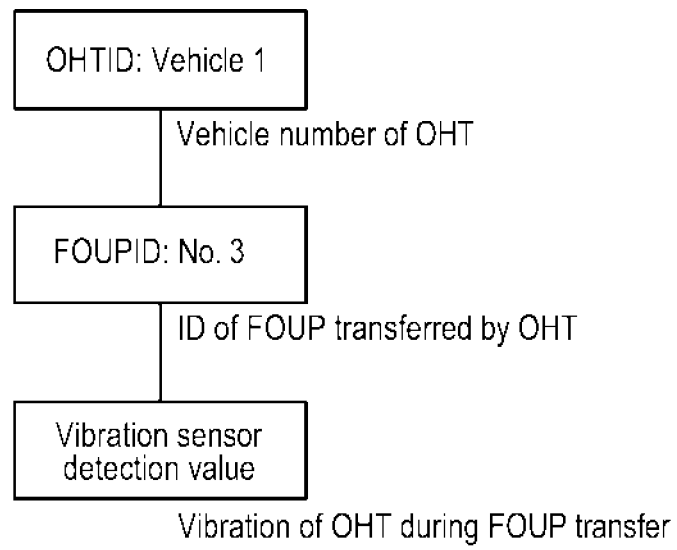
FIGS. 12A and 12B are views schematically showing data contents stored in a data-processing device according to the embodiment.

The data-processing device C receives the FOUP identification ID 4x, the sensor value of the vibration sensor 11 and the vehicle number 1x of OHT 1 by the data-processing device-side communication part Cx. The association part Cy associates the vehicle number 1x of the OHT 1, the FOUP identification ID 4x and the sensor value of the vibration sensor 11 with each other and preserves (stores or accumulates) them in the database Cd (vibration sensor detection value preservation process). An example of preserved data at this time is schematically shown in FIG. 12A.

In addition, in the transfer abnormality detection system X according to the present embodiment, the FOUP identification ID 4x of the FOUP 4 is read by the FOUP identification ID-reading part 2x of the load port 2 at the time when the FOUP 4 is set on the mounting table 23 of the load port 2. The read FOUP identification ID 4x is transmitted to the data-processing device C by the load port-side communication part 2y. Then, when performing a process for purging the inside of the FOUP 4 (bottom purge process), the transfer abnormality detection system X according to the present embodiment detects the pressure of an exhaust gas using the pressure sensor provided in association with the exhaust purge nozzle 9 of the load port 2, and transmits the detection value (pressure value) to the data-processing device C.

The data-processing device C receives the FOUP identification ID 4x and the pressure value by the data-processing device-side communication part Cx, associates, by the association part Cy, the FOUP identification ID 4x and the pressure value with the data of the same FOUP identification ID 4x among the data preserved in the database Cd at the time of completion of the vibration sensor detection value preservation process, and preserves (stores or accumulates) them in the database Cd (a process of adding the state data of FOUP 4 to the vibration sensor detection value of the OHT 1).

Figure 12B:
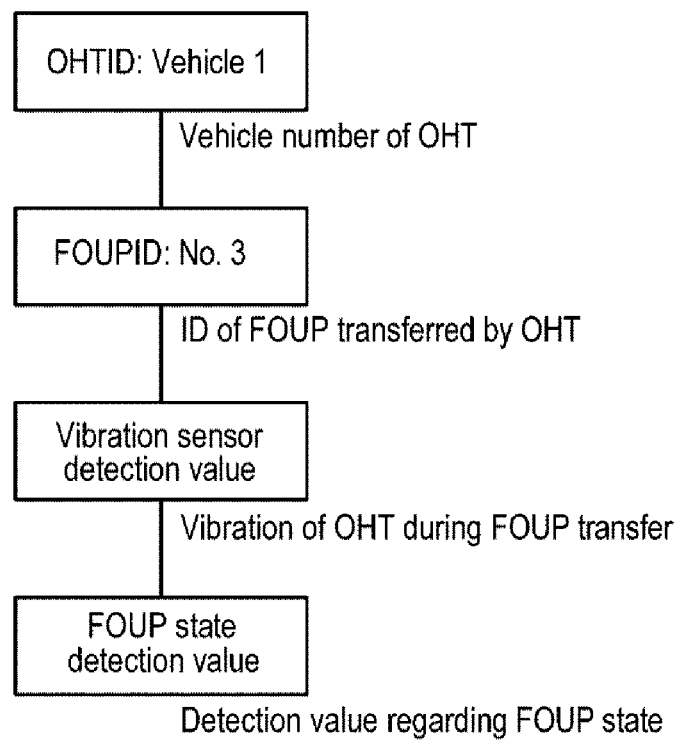

In addition, at the time of a mapping process performed by the mapping part m, the transfer abnormality detection system X according to the present embodiment transmits a wafer position as a detection value of the mapping sensor to the data-processing device C by the load port-side communication part 2y. The data-processing device C receives the wafer position by the data-processing device-side communication part Cx. The association part Cy associates the wafer position with the data of the same FOUP identification ID 4x using the FOUP identification ID 4x as a key, and preserves (stores or accumulates) it in the database Cd (a process of adding the state data of FOUP 4 to the vibration sensor detection value of the OHT 1). The process of adding the state data of the FOUP 4 to the vibration sensor detection value of the OHT 1 is a process executed individually for each sensor that detects the state of the FOUP 4. That is, in the present embodiment, there are provided two types of FOUP state detection part (the pressure sensor and the mapping sensor) for detecting the state of FOUP 4. Therefore, the process of adding the state data of FOUP 4 for one FOUP 4 to the vibration sensor detection value of the OHT 1 is performed twice. An example of the preserved data at the time of completing the process of adding the state data of FOUP 4 to the vibration sensor detection value of the OHT 1 is schematically shown in FIG. 12B.

Thus, in the data-processing device C, the vibration value as the detection value of the vibration sensor 11 provided in the OHT 1 and the detection values of various sensors provided in the load port 2 (the pressure value of the pressure sensor and the wafer position of the mapping sensor in this embodiment) are associated with the FOUP identification ID 4x assigned to the FOUP 4 and the vehicle number 1x assigned to the OHT 1, thereby creating a database. In the present embodiment, the measurement date and time is stored together with the vehicle number 1x of the OHT 1, the FOUP identification ID 4x, the sensor value of the vibration sensor 11, the pressure value of the pressure sensor and the wafer position of the mapping sensor. Then, based on the preserved data, the data-processing device C according to the present embodiment determines whether the vibration of the OHT 1 is a vibration caused by the OHT 1 or a vibration caused by the FOUP 4. That is, the determination part Cz determines an abnormality of one or both of the OHT 1 and the FOUP 4 by combining the FOUP state detection information based on the sensor values (the pressure value and the wafer position) detected by the specific sensors 2c (the pressure sensor and the mapping sensor in the present embodiment) provided in the load port 2 and the OHT vibration information based on the sensor value of the vibration sensor 11 provided in the OHT 1 (determination process).

In this regard, the expansion of a gap between the loading/unloading port 41 of the FOUP 4 and the FOUP door 43 may be determined based on the change in the pressure value of the exhaust gas detected by the pressure sensor provided in association with the exhaust purge nozzle 9 of the load port 2. That is to say, if it is found that the pressure of the gas exhausted from the exhaust purge nozzle 9 is low, it is understood that the exhaust amount through the gap between the loading/unloading port 41 of the FOUP 4 and the FOUP door 43 is large. It can be determined that the gap between the loading/unloading port 41 of the FOUP 4 and the FOUP door 43 is expanded, which makes it possible to specify the deformation of the FOUP 4. Furthermore, as described above, when the detected value of the mapping sensor is different from the previous detected value (when the positional displacement of the wafer W is generated), it can be considered that the FOUP 4 is deformed and the position of the wafer W is changed. That is to say, the gap between the wafers W stored in multiple stages inside the FOUP 4 is changed as the deformation of the FOUP 4 progresses. Therefore, the deformation of the FOUP 4 can be specified by detecting such a change, or the deformation of the FOUP 4 can be specified by detecting that the wafers W are stored in an inclined posture.

The FOUP state detection information of the present embodiment is the detection information which specifies whether the state of the FOUP 4 having the FOUP identification ID 4x associated with the sensor value is "good" or "deteriorated" by comparing the sensor value of the specific sensor 2c (the pressure sensor or the mapping sensor) provided in the load port 2 with a threshold value set to correspond to each specific sensor 2c (the pressure sensor or the mapping sensor) provided in the load port 2. Furthermore, the OHT vibration information of the present embodiment is the detection information which specifies the vibration of the OHT 1 having the vehicle number 1x associated with the sensor value is "large" or "small" by comparing the sensor value of the vibration sensor 11 provided in the OHT 1 with a preset threshold value.

Figures 13, 14:
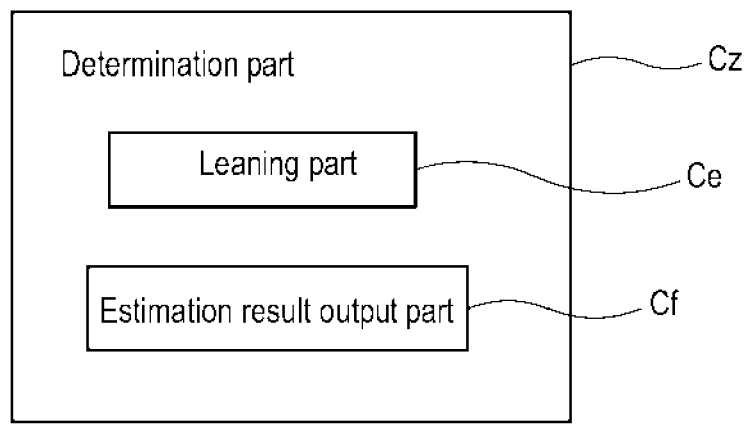
FIG. 13 is a view showing the determination-processing contents in a determination part according to the embodiment.
FIG. 14 is a functional block diagram of a data-processing device according to a second embodiment of the present disclosure.

In the determination process according to the present embodiment, as shown in FIG. 13, when the vibration of the OHT 1 is "large" and the state of the FOUP 4 is "deteriorated", it is determined that both the OHT 1 and the FOUP 4 are abnormal. When the vibration of the OHT 1 is "large" and the state of the FOUP 4 is "good", it is determined that only the OHT 1 is abnormal. When the vibration of the OHT 1 is "small" and the state of the FOUP 4 is "deteriorated", it is determined that only the FOUP 4 is abnormal. When the vibration of the OHT 1 is "small" and the state of the FOUP 4 is "good", it is determined that both the OHT 1 and the FOUP 4 are not abnormal (are normal).

For example, the determination result obtained by the determination part Cz of the data-processing device C may be displayed on a display that can be viewed by a user, or may be generated as a sound from an appropriate speaker or the like to notify a user, whereby the user can grasp the cause of a transfer abnormality.

According to the transfer abnormality detection system X and the transfer abnormality detection method according to the present embodiment, the FOUP identification ID 4x assigned to the FOUP 4, the vehicle number 1x given to the OHT 1, the detection value obtained by the specific sensor 2c provided in the load port 2 and the detection value obtained by the vibration sensor 11 provided in the OHT 1 are associated and preserved by the data-processing device C. The deformed or deteriorated state of the FOUP 4 can be specified based on the detection value of the specific sensor 2c provided in the load port 2. When the detection value of the vibration sensor 11 is abnormal, by referring to the state of the FOUP 4, it is possible to determine and specify whether the abnormal vibration of the OHT 1 generated during the transfer process of the FOUP 4 is a vibration caused by the transfer of a deformed or deteriorated FOUP 4 or a vibration caused by the failure or deterioration of the OHT 1 itself.

Conventionally, the abnormal vibration of the OHT 1 caused by the deformation or deterioration of the FOUP 4 is treated as an abnormality of all the OHTs 1. The operations of all the related devices including the OHTs 1 are suspended to check an abnormality, and inspections are conducted. However, such a countermeasure leads to an opportunity loss.

In contrast, according to the transfer abnormality detection system X and the transfer abnormality detection method according to the present embodiment, it is possible to determine whether the vibration of the OHT 1 that can be grasped based on the sensor value (vibration detection value) of the vibration sensor 11 is a vibration caused by the failure or deterioration of the OHT 1 or a vibration caused by the deformation or deterioration of the FOUP 4. When the vibration of the OHT 1 is an abnormal vibration caused by the deformation or deterioration of the FOUP 4, the cause of the abnormality can be eliminated by merely replacing the FOUP 4. Upon detecting an abnormality, it is possible to quickly find out the location of occurrence of the abnormality in the whole wafer-manufacturing process. This makes it possible to reduce the number of times of stopping the operation of all the related devices to check an abnormality. This also makes it possible to eliminate or alleviate a problem that the time, effort or cost is wasted.

In addition, according to the transfer abnormality detection system X and the transfer abnormality detection method according to the present embodiment, by analyzing the data preserved in the data-processing device C, it is possible to specify the deterioration information related to the OHT 1 for each vehicle number $1x$, or the deterioration information related to the FOUP 4 for each FOUP identification ID $4x$. It is also possible to predict a replacement time based on the information. By replacing the OHT 1 or the FOUP 4 that has reached the replacement time with a new OHT 1 or a new FOUP 4, it is possible to reduce the frequency of occurrence of errors due to the failure of the OHT 1 or the deformation of the FOUP 4. Thus, the stop time of a semiconductor-manufacturing apparatus is shortened and the productivity is improved.

In particular, considering that the task of providing instruments such as a sensor and the like in all the FOUPs 4 is on a large scale and complex, the transfer abnormality detection system X and the transfer abnormality detection method according to the present embodiment are advantageous in that it is only necessary to assign an FOUP identification ID $4x$ to the currently available FOUP 4 or to use an existing FOUP identification ID $4x$ and in that it is not necessary to mount a sensor power supply on each FOUP 4 as compared with an embodiment in which a sensor is provided for each FOUP 4. There is no need to newly prepare a dedicated transfer container applicable to the transfer abnormality detection system X and the transfer abnormality detection method. Thus, the transfer abnormality detection system X and the transfer abnormality detection method can be easily introduced into the manufacturing sites (manufacturing lines).

In addition, the transfer abnormality detection system X and the transfer abnormality detection method according to the present embodiment are advantageous in that, by setting the installation target of the sensor for detecting the state of the FOUP 4 to the load port 2, as compared with an embodiment in which a sensor is provided for each FOUP 4, it is possible to reduce the absolute number of sensors subjected to maintenance and to alleviate the burden of maintenance and it is not necessary to pay attention to the failure of instruments such as a sensor and the like caused by the heat or water intrusion at the time of cleaning the FOUP 4 with hot water. Furthermore, the power supply to the FOUP identification ID-reading part $2x$, the sensor $2c$ and the load port communication part $2y$ of the load port 2 can be relatively easily performed using the electrical system of the load port 2.

Moreover, according to the transfer abnormality detection system X and the transfer abnormality detection method according to the present embodiment, it is possible to predict the demand of the transfer container. That is to say, by predicting the replacement time of the FOUP 4 as a transfer container, the number of FOUPs 4 predicted to be replaced (discarded) at the replacement time can be predicted as the number of new FOUPs 4 to be introduced. Furthermore, according to the transfer abnormality detection system X and the transfer abnormality detection method according to the present embodiment, it is considered that the data preserved and collected in the data-processing device C can be used as big data, and the cause of deterioration of the transfer container or the cause of deterioration of the container transfer device can be pursued by data mining.

Further, in the transfer abnormality detection system X and the transfer abnormality detection method according to the present embodiment, machine learning may be used to analyze the data preserved in the data-processing device C. That is, as the determination part Cz of the data-processing device C, as shown in FIG. 14, the determination part Cz provided with a learning part Ce is used. In such an embodiment (second embodiment), as in the first embodiment, during the process of transferring the FOUP 4 by the OHT 1 and at a predetermined timing at which the FOUP 4 is mounted over the load port 2, the vehicle number $1x$ of the OHT 1, the sensor value detected by the vibration sensor 11 provided in the OHT 1, the FOUP identification ID $4x$ and the sensor value detected by the specific sensor $2c$ provided in the load port 2 are transmitted to the data-processing device C, associated with each other and preserved (stored or accumulated) in the data-processing device C as a record to which the measurement date and time is given. In addition, other configurations are the same as those of the first embodiment. Therefore, the detailed description thereof is omitted.

In the second embodiment, the data preserved in the data-processing device C is processed and analyzed by the learning part Ce. This makes it possible to estimate whether the abnormal vibration of the OHT 1 generated during the process of transferring the FOUP 4 is an abnormal vibration caused by either the OHT 1 or the FOUP 4 or an abnormal vibration caused by both the OHT 1 and the FOUP 4. The data can be used for predictive maintenance such as the check of the state of the OHT 1 or the FOUP 4, the prediction of the replacement time thereof, or the like. It is possible to estimate the part that adversely affects the vibration of the OHT 1 based on the data regarding the deformation or deterioration point of the FOUP 4.

The specific configuration of the determination part Cz will be described below. As shown in FIG. 14, the determination part Cz includes a learning part Ce and an estimation result output part Cf. The learning part Ce is constituted by, for example, a neural network.

Hereinafter, the procedure for constructing a learned model by the learning part Ce of the data-processing device C of the present embodiment will be described. First, from the data (database Cd) preserved in the data-processing device C, the time series data of the sensor value of the vibration sensor 11 for each OHT 1, the date and time at which the OHT 1 is actually deteriorated or deformed and becomes unusable, or the replacement date and time of the OHT 1, the time series data of the sensor value of the sensor 2c for each FOUP 4, and the date and time at which the FOUP 4 is actually deteriorated or deformed and becomes unusable, or the replacement date and time of the FOUP 4 are extracted and inputted to the neural network of the learning part Ce. Then, in the neural network, various parameters are updated according to the inputted data, and learning proceeds. A learned model is constructed by repeating this process.

When the data for each OHT 1 or the data for each FOUP 4 preserved in the data-processing device C is inputted to the learned model constructed in the above procedure, the estimation result regarding the state of the OHT 1 or the FOUP 4 can be outputted by an estimation result output part Cf Based on the outputted information, it is possible to estimate whether the abnormal vibration generated during the process of transferring the FOUP 4 by the OHT 1 is an abnormal vibration caused by either the OHT 1 or the FOUP 4 or an abnormal vibration caused by both the OHT 1 and the FOUP 4. The data can be used for predictive maintenance such as the check of the state of the OHT 1 or the FOUP 4, the prediction of the replacement time thereof, or the like. It is possible to estimate the part that adversely affects the vibration of the OHT 1 based on the data regarding the deformation or deterioration point of the FOUP 4.

In the present embodiment, the learned model is constructed using the neural network. However, it is also possible to use other methods. Although the supervised learning is used in the present embodiment, unsupervised learning may be used. It may also be possible to use an algorithm that updates the learned model as needed. Furthermore, in the present embodiment, the date and time at which the FOUP 4 or the OHT 1 becomes unusable is extracted from the data preserved in the data-processing device C to construct a learned model. However, a learned model may be constructed using the data available when the FOUP 4 or the OHT 1 can be normally used, and the predictive maintenance may be performed. Furthermore, when the data-processing device C including the learning part Ce is used, the determination part according to the present disclosure may be realized by a part of the functions of the learning part Ce. The data-processing device C including the determination part Cz and the learning part Ce may be used.

Although the embodiments of the present disclosure have been described above, the present disclosure is not limited to the configurations of the embodiments described above. For example, in the above-described embodiments, there has been illustrated an example where the sensor values transmitted from the load port to the data-processing device are sensor values of two types of sensors. However, the sensor value transmitted from the load port to the data-processing device may be a sensor value of one type of sensor, or may be sensor values of three or more types of sensors. Furthermore, the installation location of the data-processing device may be inside or outside a factory where semiconductor manufacturing is performed, and the data of a plurality of semiconductor-manufacturing factories or a plurality of semiconductor-manufacturing processes may be collectively managed or processed by the data-processing device serving as a single host system. Moreover, it is also possible to distribute the functions of the data-processing device to a plurality of computers or servers. The format of the data preserved in the data-processing device may also be preserved in a format other than the table. In addition, in the above-described embodiments, the time series of data is shown by attaching the measurement date and time to the data preserved in the data-processing device. However, the data may be replaced by another data from which the time series can be grasped.

Examples of the sensor for directly or indirectly detecting the state of the FOUP are not limited to the above-described "pressure sensor of exhaust nozzle" and the "mapping sensor," but may include a "sensor capable of directly or indirectly detecting the time taken for the container door (FOUP door) to move from the fully closed position to the open position," a "torque sensor for measuring the rotational torque of a latch key of the container door (FOUP door)," and a "sensor capable of detecting FOUP door bulging at the time of docking." By acquiring "the movement time of the container door (FOUP door) from the fully closed position to the open position" as data, it is possible to grasp whether or not the container door (FOUP door) is difficult to open. From the sensor value (data) in which the movement time of the container door (FOUP door) from the fully closed position to the open position is long, it is possible to determine an event that the container door (FOUP door) is difficult to open, i.e., a possibility that the transfer container is deformed. In addition, it may be possible to attach a sensor capable of measuring the torque or pressure necessary for docking the container door (FOUP door) and the load port door during the docking process of the FOUP.

In addition, by acquiring the "rotational torque value of a latch key of the container door (FOUP door)" as data, it is possible to grasp whether or not the latch key is difficult to rotate. From the data in which the rotational torque value is large, it is possible to determine an event that the latch key is difficult to rotate, i.e., a possibility that the transfer container is deformed.

Furthermore, as for the connection mechanism provided at the load port door to connect the container door (FOUP door) to the load port door, a sensor capable of detecting an appropriate connection state established by the connection mechanism may be provided at the load port, and the connection failure caused by the deformation of the transfer container may be estimated and determined according to a change in the detected value of the sensor. In addition, by acquiring a sensor value from a gauge for measuring an oxygen concentration in the exhaust gas exhausted from the exhaust nozzle, it is possible to estimate and determine how much the inflow of an ambient air due to the deformation of the transfer container affects the wafers contained in the transfer container. In addition, by detecting a lock error of the lock claw provided at the mounting table of the load port, it is possible to estimate the scraping of the locked portion (the portion engaging with the lock claw) provided on the bottom surface of the transfer container. In addition, the number of lock errors of the lock claw may be measured.

In the above-mentioned embodiment, the FOUP used for wafer transfer is adopted as the transfer container. However, in the present disclosure, it is also possible to use transfer containers other than the FOUP, for example, a MAC (Multi Application Carrier), an H-MAC (Horizontal-MAC), an FOSB (Front Open Shipping Box), and the like.

As the container transfer device, it may be possible to use an appropriate transfer device other than the OHT. The identification ID of the container transfer device is not limited to the vehicle number and may be an appropriate identifier.

If the data-processing device is capable of determining a cause of an abnormal vibration by using a data-mining method or a machine-learning method, the setting of the threshold value in the determination part of the data-processing device may be unnecessary, or the threshold value may be calculated.

When the detection (measurement) of a tact time indicates that time is taken with respect to the standard tact time, if there is a tendency that time is taken just as much as a specific load port takes time, it is possible to determine that there is a time loss due to the load port. Thus, a message prompting the adjustment of the load port is notified. If there is a tendency that time is taken even though a particular transfer container is placed on any load port, it is possible to determine that a time loss has occurred due to the transfer container. Thus, a message for checking the transfer container or a message prompting the replacement thereof may be notified.

In the above-described embodiments, the nitrogen gas is illustrated as the environmental gas used for a bottom purge process or the like. However, the present disclosure is not limited thereto. It may be possible to use an appropriate gas (inert gas) according to an application environment such as a dry gas, an argon gas or the like.

Furthermore, the container door (FOUP door) may be temporarily kept in an inclined posture (with an operation of drawing a partial arc-like locus) in the process of moving from the fully closed position to the fully opened position. As the mounting device, it may be possible to use a mounting device other than the load port. The transfer target objects stored in the transfer container may be other than the wafers.

In addition, the specific configurations of the respective parts are not limited to those of the above-described embodiments, and various modifications may be made without departing from the scope of the present disclosure.

According to the present disclosure, in the data-processing device, the vibration information of the transfer device itself obtained by the vibration abnormality detection part provided in the transfer container and the state information of the transfer container during the mounting of the transfer container on the mounting device obtained by the container state detection part provided in the mounting device are combined to perform a determination process for determining an abnormality in either or both of the transfer device and the transfer container. This makes it possible to provide a transfer abnormality detection system and a transfer abnormality detection method capable of, when a detection value of a vibration detection part provided in a container transfer device is abnormal, specifying whether the abnormal vibration is caused by the transfer of a deformed or deteriorated transfer container or by the failure of the container transfer device itself.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer abnormality detection system capable of receiving information from a container transfer device configured to transfer a transfer container accommodating a transfer target object along a predetermined path and a mounting device configured to load the transfer container that is transferred by the container transfer device, the system comprising:
   a determination part configured to:
      record which container transfer device is transferring the transfer container based on a container identification ID assigned to each transfer container and a transfer device identification ID assigned to each transfer device; and
      determine an abnormality in either or both of the container transfer device and the transfer container by combining vibration detection information of the container transfer device obtained by a vibration detection part provided in the container transfer device and state detection information of the transfer container obtained by a container state detection part provided in the mounting device.

* * * * *